United States Patent
Xiang

(10) Patent No.: US 9,465,081 B2
(45) Date of Patent: Oct. 11, 2016

(54) BATTERY POWER DETECTING DEVICE AND METHOD

(71) Applicant: Zhiyong Xiang, Guangdong (CN)

(72) Inventor: Zhiyong Xiang, Guangdong (CN)

(73) Assignee: HUIZHOU KIMREE TECHNOLOGY CO., LTD. SHENZHEN BRANCH, Shenzhen (CN)

( * ) Notice: Subject to any disclaimer, the term of this patent is extended or adjusted under 35 U.S.C. 154(b) by 394 days.

(21) Appl. No.: 14/061,413

(22) Filed: Oct. 23, 2013

(65) Prior Publication Data

US 2015/0035540 A1     Feb. 5, 2015

(30) Foreign Application Priority Data

Aug. 1, 2013   (CN) .......................... 2013 2 0467519

(51) Int. Cl.
*G01R 31/36* (2006.01)
*A24F 47/00* (2006.01)

(52) U.S. Cl.
CPC ......... *G01R 31/3624* (2013.01); *A24F 47/008* (2013.01)

(58) Field of Classification Search
CPC ................................................. G01R 31/3624
USPC ........................................................ 324/426
See application file for complete search history.

(56) References Cited

U.S. PATENT DOCUMENTS

| | | | | |
|---|---|---|---|---|
| 4,931,737 A * | 6/1990 | Hishiki | ................ | G01R 15/005 324/428 |
| 6,140,928 A * | 10/2000 | Shibuya | ............ | G01R 31/3655 320/134 |
| 6,515,452 B2 * | 2/2003 | Choo | ................. | G01R 31/3624 320/132 |
| 7,624,292 B2 * | 11/2009 | Nishida | .............. | G01R 31/3624 320/134 |
| 7,777,456 B2 * | 8/2010 | Morita | ................... | H02J 7/0018 307/109 |
| 8,441,169 B2 * | 5/2013 | Chen | ...................... | F04B 43/095 310/317 |
| 9,146,283 B2 * | 9/2015 | Coccio | ............... | G01R 31/3634 |
| 2003/0006735 A1 * | 1/2003 | Kawakami | ........... | G01R 31/361 320/133 |
| 2009/0251149 A1 * | 10/2009 | Buckner | .............. | G01R 1/0408 324/426 |
| 2010/0090702 A1 * | 4/2010 | McMillen | .......... | G01R 31/3624 324/426 |
| 2011/0265806 A1 * | 11/2011 | Alarcon | .................. | A24F 47/00 131/273 |
| 2014/0074747 A1 * | 3/2014 | Gao | ........................ | G06Q 50/14 705/346 |

* cited by examiner

*Primary Examiner* — Drew A Dunn
*Assistant Examiner* — Jerry D Robbins
(74) *Attorney, Agent, or Firm* — Tim Tingkang Xia, Esq.; Locke Lord LLP

(57) ABSTRACT

A battery power detecting device and method are provided. It can detect the battery power of a battery rod in a non-disposable electronic cigarette. The battery power detecting device includes a spare battery unit, a current sampling unit, a voltage sampling unit, a charging control unit, a main control unit, and a power display unit. The main control unit is configured to control the charging control unit to adjust and output the voltage provided by the spare battery unit according to the charging current sampled by the current sampling unit, in order to make the charging current equal to a preset current. Then, the main control unit calculates the battery power of the battery rod according to the charging voltage currently sampled by the voltage sampling unit, and finally controls the power display unit to display the battery power of the battery rod.

6 Claims, 5 Drawing Sheets

BATTERY POWER DETECTING DEVICE AND METHOD

CROSS-REFERENCE TO RELATED APPLICATIONS

This non-provisional application claims priority under 35 U.S.C. §119(a) on Patent Application No. 201320467519.1, filed in P.R. China on Aug. 1, 2013, the entire contents of which are hereby incorporated by reference.

FIELD OF THE INVENTION

The present invention relates to the field of electronic cigarettes, and more particularly, relates to a battery power detecting device and method for detecting the battery power of a battery rod in an electronic cigarette.

BACKGROUND

An electronic cigarette includes a battery rod and an atomizer, and the battery rod supplies electric power to the atomizer in the electronic cigarette. Electronic cigarettes are classified as disposable electronic cigarettes and non-disposable electronic cigarettes. In disposable electronic cigarettes, the battery rods thereof cannot be recharged. In non-disposable electronic cigarettes, the battery rods thereof are rechargeable.

In the prior art, methods for recharging the battery rods include using electronic cigarette cases and using USB chargers. Nowadays, most USB chargers and electronic cigarette cases for battery rods in the electronic cigarettes in the market have only "in charge" and "fully charged" status indications represented by LED lamps, and some USB chargers and electronic cigarette cases even have no LED lamps.

Because two exposed electrodes of a battery rod are connected to two electrodes of a heating wire and are not connected to two electrodes of a battery of the battery rod, the voltage and power of the battery are unable to be directly measured. A user is usually unable to know how much power the battery rod has been charged or how much power remains in the battery rod. To ensure enough power in use, the user may do not consider whether the battery rod have enough power or not, just recharge the battery rod firstly. Thus, the lifespan of the battery rod may be decreased, which may inconvenience the user too much.

Therefore, defects exist in the detection for the battery power of the battery rod in the prior art, which needs to be improved.

SUMMARY

The object of the present invention is to provide a battery power detecting device and method, aiming at the defects that it is difficult to detect the battery power of the aforementioned battery rod in the prior art.

In order to realize the object mentioned above, technical schemes are provided as follows.

In one aspect, a battery power detecting device is provided to detect the battery power of a battery rod of an electronic cigarette. The battery power detecting device comprises a spare battery unit, a current sampling unit, a voltage sampling unit, a charging control unit, a main control unit, and a power display unit.

The main control unit is connected to the spare battery unit, the current sampling unit, the voltage sampling unit, the charging control unit, and the power display unit respectively; the current sampling unit, the voltage sampling unit, and the charging control unit are all connected to the battery rod; and both the charging control unit and the power display unit are connected to the spare battery unit.

The spare battery unit is configured to provide a power supply voltage to the main control unit, the charging control unit, and the power display unit.

The current sampling unit is configured to sample the charging current of the battery rod, and transmit the sampled charging current to the main control unit.

The main control unit is configured to output a charging control signal to the charging control unit according to the charging current.

The charging control unit is configured to adjust the charging voltage in the present charging status according to the charging control signal, so as to make the charging current of the battery rod equal to a preset current.

The voltage sampling unit is configured to sample the adjusted charging voltage of the battery rod, and transmit the charging voltage to the main control unit.

The main control unit is further configured to calculate the battery power of the battery rod according to the charging voltage, and output a power display signal to the power display unit.

The power display unit is configured to display the battery power of the battery rod according to the power display signal.

In one embodiment, the spare battery unit includes a battery.

In one embodiment, the battery is a replaceable battery.

In one embodiment, the battery is a rechargeable battery.

In one embodiment, the spare battery unit further includes a USB interface unit and a charging management unit; the USB interface unit, the charging management unit, the rechargeable battery, and the charging control unit are connected in series; and when battery power detecting device is connected to an external power supply, the charging management unit is configured to control the external power supply to charge the rechargeable battery with constant current.

In one embodiment, the charging management unit includes a charging management chip, and the type of the charging management chip is VA7204.

In one embodiment, the main control unit includes a microprocessor, and the type of the microprocessor is SN8P2712.

In one embodiment, the battery rod includes a positive output end and a negative output end. The charging control unit includes a MOS transistor, a boost converter chip, a triode, an inductor, a diode, a first resistor, a second resistor, and a third resistor; and the type of the boost converter chip is CP2121. The fourth pin of the boost converter chip is connected to the microprocessor, and the fourth pin of the boost converter chip is further connected to the base of the triode via the first resistor; the base of the triode is further connected to the ground via the second resistor, the emitter of the triode is connected to the ground, the collector of the triode is connected to the source of the MOS transistor via the third resistor, and the collector of the triode is further connected to the gate of the MOS transistor; the source of the MOS transistor is configured to receive a voltage provided by the spare battery unit, and the drain of the MOS transistor is connected to the anode of the diode via the inductor; the fifth pin of the boost converter chip is connected between the MOS transistor and the inductor, the first pin of the boost converter chip is connected between the diode and the inductor, and the cathode of the diode is connected to the positive output end.

In one embodiment, the voltage sampling unit includes a first divider resistor and a second divider resistor; one end of the first divider resistor is connected to the positive output end, the other end of the first divider resistor is connected to one end of the second divider resistor, and the other end of the second divider resistor is connected to the ground; the sharing node of the first divider resistor and the second divider resistor is connected to the microprocessor.

In one embodiment, the current sampling unit includes a current sampling resistor and a fourth resistor; one end of the current sampling resistor is connected to both one end of the fourth resistor and the negative output end, the other end of the current sampling resistor is connected to the ground, and the other end of the fourth resistor is connected to the microprocessor.

In one embodiment, the power display unit includes at least one of an LED lamp, an LED display, and an LCD display.

In another aspect, a battery power detecting method is provided to detect the battery power of a battery rod of an electronic cigarette in a charging process. The battery power detecting method comprises following steps.

S1, a current sampling unit samples the charging current of the battery rod, and transmits the sampled charging current to a main control unit.

S2, the main control unit generates a charging control signal according to the charging current, and transmits the charging control signal to a charging control unit.

S3, the charging control unit adjusts the charging voltage in the present charging status according to the charging control signal, so as to make the charging current equal to a preset current.

S4, a voltage sampling unit samples the adjusted charging voltage of the battery rod, and transmits the sampled charging voltage to the main control unit.

S5, the main control unit calculates the battery power of the battery rod according to the charging voltage, and outputs a power display signal to a power display unit.

S6, the power display unit displays the battery power of the battery rod according to the power display signal.

In one embodiment, the step S5 includes these sub-steps.

S51, using the following formula to calculate the battery voltage of the battery rod according to the charging voltage:

$$U\text{bat}=Uc-U1-U2;$$

wherein, Ubat is the battery voltage of the battery rod, Uc is the charging voltage, U1 is an internal voltage drop of the battery rod, and U2 is a voltage drop of a current sampling resistor.

S52, calculating the battery power of the battery rod according to the voltage Ubat.

By implementing the battery power detecting device and method in the present invention, the following advantages can be achieved. In the present invention, a charging control unit is used to charge the battery, and a current sampling unit is used to sample the charging current at the same time. A main control unit controls the charging control unit to adjust the charging voltage according to the charging current, so as to make the charging current reach a preset current. When the charging current reaches the preset current, the main control unit calculates the voltage of the battery in the battery rod according to the charging voltage sampled by the voltage sampling unit, and then calculates the power of the battery according to the voltage of the battery, and further controls the power display unit to display the particular information of the power. In the charging process of the battery rod, it may spend a short time for adjusting the charging current of the battery rod to reach the preset current, and there is a simple conversion relationship between the sampled charging voltage and the voltage of the battery in the battery rod when determining whether the charging current of the battery rod has reached the preset current, so the voltage of the battery can be calculated according to the currently sampled charging voltage, and the power of the battery can be calculated according to the voltage of the battery. The power of the battery can be further displayed. In this way, the battery rod only needs to be inserted in or screwed in the battery power detecting device for a very short time and be charged by the preset current, and thus the power of the battery rod can be displayed. It is very convenient for users to detect the power of the battery rod.

BRIEF DESCRIPTION OF THE DRAWINGS

The present application will be further described with reference to the accompanying drawings and embodiments in the following, in the accompanying drawings.

DETAILED DESCRIPTION OF THE PREFERRED EMBODIMENT

To make the objects, technical schemes and advantages more clearly, the present application may be further described in detail with reference to the accompanying drawings and embodiments.

To overcome the drawbacks that it is difficult to detect the power of the battery rod in the prior art, a battery power detecting device and method are provided in the present application to detect the power of the battery rod directly.

In the charging process of the battery rod in the present application, it may spend a short time for adjusting the charging current of the battery rod to reach the preset current, and there is a simple conversion relationship between the sampled charging voltage and the voltage of the battery in the battery rod when determining whether the charging current of the battery rod has reached the preset current, so the voltage of the battery can be calculated according to the currently sampled charging voltage, and the power of the battery can be calculated according to the voltage of the battery. The power of the battery can be further displayed. It is very convenient for users to detect the power of the battery rod.

Figure 1:
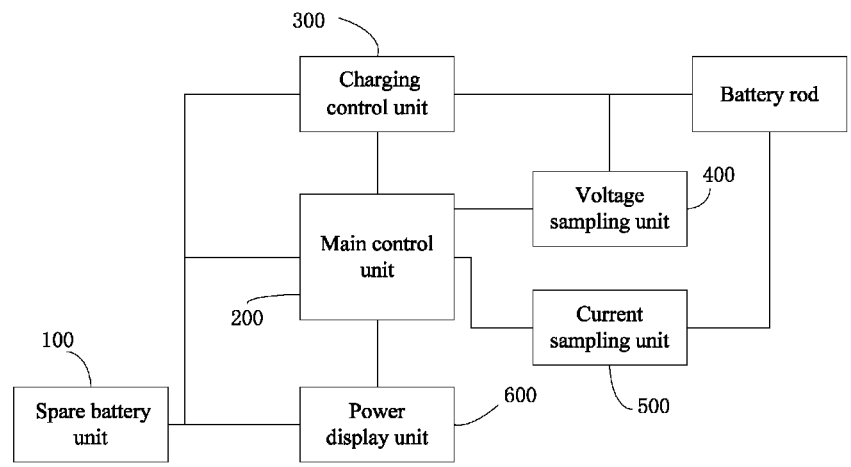
FIG. 1 is a block diagram of a battery power detecting device of the present application.

Referring to FIG. 1, which is a block diagram of a battery power detecting device of the present application.

The present application can be used to charge battery rods. Battery rods can be classified as two types. One type of battery rod has a charging management circuit itself, and another type of battery rod has no charging management unit. The present application can detect battery power of both two types of battery rods.

In particular, a battery power detecting device of the present application includes a spare battery unit 100, a current sampling unit 500, a voltage sampling unit 400, a charging control unit 300, a main control unit 200, and a power display unit 600.

The main control unit 200 is connected to the spare battery unit 100, the current sampling unit 500, the voltage sampling unit 400, the charging control unit 300, and the power display unit 600 respectively. The current sampling unit 500, the voltage sampling unit 400, and the charging control unit 300 are all connected to a battery rod (not labeled). Both the charging control unit 300 and the power display unit 600 are connected to the spare battery unit 100.

The spare battery unit 100 is configured to provide a power supply voltage to the main control unit 200, the charging control unit 300, and the power display unit 600. The spare battery unit includes a battery, and the battery can be a rechargeable battery or a replaceable battery.

The current sampling unit 500 is configured to sample the charging current of the battery rod, and transmit the sampled charging current to the main control unit 200.

The main control unit 200 is configured to generate a charging control signal according to the charging current, and transmit the charging control signal to the charging control unit 300.

The charging control unit 300 is configured to adjust the charging voltage in the present charging status according to the charging control signal, so as to make the charging current equal to a preset current.

The voltage sampling unit 400 is configured to sample the adjusted charging voltage of the battery rod, and transmit the sampled charging voltage to the main control unit 200.

The main control unit 200 is further configured to calculate the battery power of the battery rod according to the charging voltage, and output a power display signal to the power display unit 600.

The power display unit 600 is configured to display the battery power of the battery rod according to the power display signal.

For example, when the preset current is 60 mA, from the moment that the battery rod is inserted into or screwed into the battery power detecting device, it may take only about 0.5 s-10 s for the charging current to reach the preset current. Once the charging current reaches the preset current, there is a following relationship between a charging voltage sampled by the voltage sampling unit 400 (i.e., the latest adjusted charging voltage) and a voltage of a battery of the battery rod:

$$Ubat = Uc - U1 - U2$$

Wherein, Ubat is the voltage of the battery in the battery rod, and Uc is the aforementioned latest adjusted charging voltage. U1 is an internal voltage drop of the battery rod. The internal voltage drop is relative to a value of the charging current. When the charging current is 120 mA, the internal voltage drop is generally 0.2V; and when the charging current is 60 mA, the internal voltage drop is generally 0.1V. U2 is a voltage drop of a current sampling resistor. In this embodiment, the resistance of the current sampling resistor is 2.2Ω. At this time, if the charging current is 60 mA, the voltage drop of the current sampling resistor is 60 mA*2.2Ω=0.132V, and Ubat=Uc−0.232V.

The power display unit 600 is connected between the spare battery unit 100 and the main control unit 200, and is configured to display the concrete information for the power of the battery in the battery rod under control of the main control unit 200. The power display unit 600 includes at least one of a LED lamp, a LED display, and a LCD display. In this way, the battery rod does not need to be disassembled, and only needs to be inserted in the battery power detecting device to measure and display the battery power of the battery rod. This displaying method is explicit, so that users can know the battery power clearly. Furthermore, the battery power detecting device responds quickly, and only needs a short period of time to display the battery power of the battery rod.

Additionally, because the real purpose of providing the battery power detecting device is not to charge the battery rod, but to utilize charging characteristics of the battery rod by charging the battery rod for a short period of time, other functions (e.g., an overcharge protection function) of the circuits of the battery power detecting device can be not considered. Therefore, the battery power detecting device has a small size and is easy to carry.

When the battery power of the battery rod is calculated according to the charging voltage of the battery rod, the calculation can be completed by looking up a preset tabulation. For example, the following Tabulation 1 can be used to complete the calculation.

Tabulation 1

| | Charging voltage (V) | | | | | | | | | |
|---|---|---|---|---|---|---|---|---|---|---|
| | 3.0 | 3.5 | 3.6 | 3.70 | 3.75 | 3.80 | 3.85 | 3.9 | 4.0 | 4.1 | 4.2 |
| Battery power percentage (%) | 0 | 5 | 10 | 20 | 40 | 60 | 70 | 80 | 85 | 90 | 100 |

Figure 2:
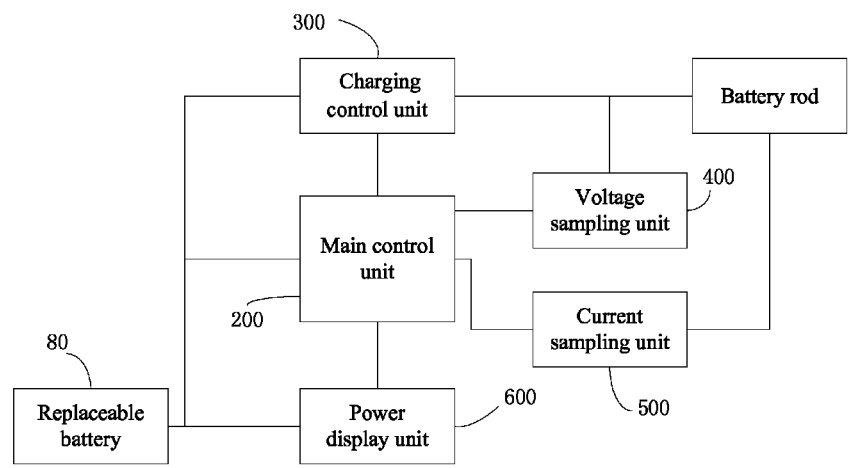
FIG. 2 is a block diagram of a battery power detecting device of a first embodiment of the present application.

Referring to FIG. 2, which is a block diagram of a battery power detecting device of a first embodiment of the present application.

In the first embodiment, the aforementioned battery in the spare battery unit 100 is a replaceable battery 80.

Figure 3:
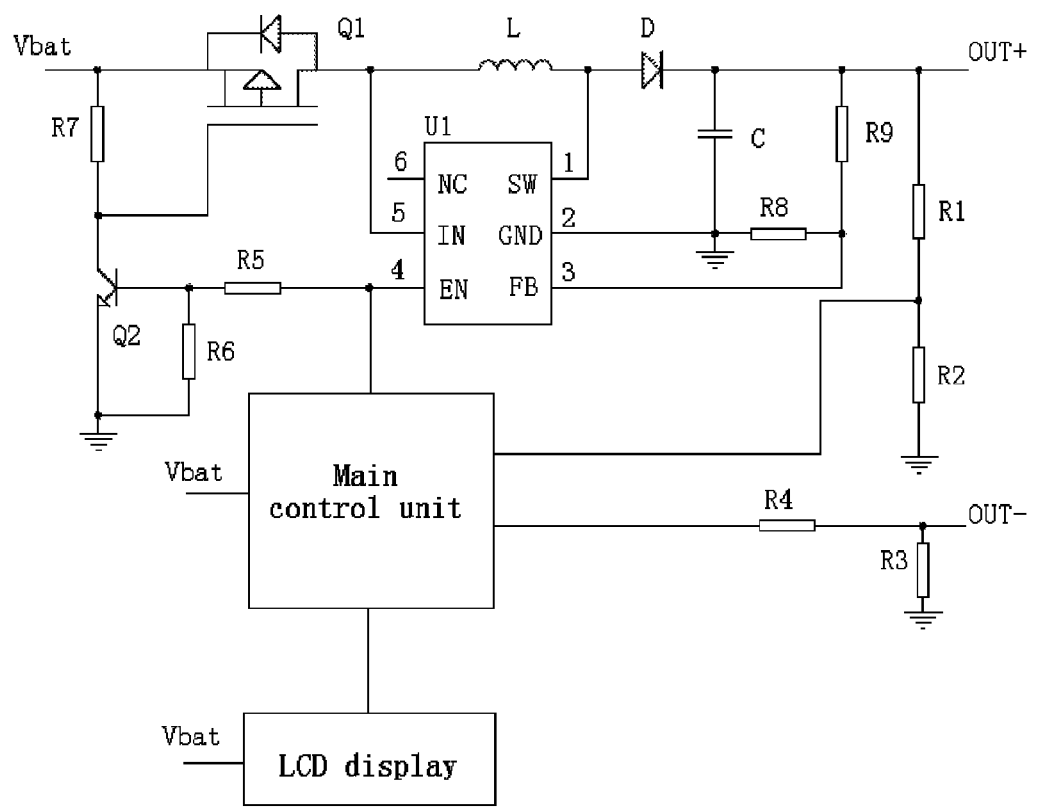
FIG. 3 is a circuit diagram of the battery power detecting device of the first embodiment of the present application.

Referring to FIG. 3, which is a circuit diagram of the battery power detecting device of the first embodiment of the present application.

The battery rod includes a positive output end OUT+ and a negative output end OUT−.

The charging control unit 300 includes a MOS transistor Q1, a boost converter chip U1, a triode Q2, an inductor L, a diode D, a first resistor R5, a second resistor R6, and a third resistor R7. The type of the boost converter chip is CP2121. The MOS transistor Q1 is a P-type transistor, and the triode Q2 is a NPN-type transistor.

The main control unit 200 includes a microprocessor, and the type of the microprocessor is SN8P2712. The fourth pin of the boost converter chip U1 is connected to the microprocessor, and the fourth pin of the boost converter chip U1 is further connected to a base of the triode Q2 via the first resistor R5. The base of the triode Q2 is further connected to a ground via the second resistor R6. The emitter of the triode Q2 is connected to the ground, the collector of the triode Q2 is connected to the source of the MOS transistor Q1 via the third resistor R7, and the collector of the triode Q2 is further connected to the gate of the MOS transistor Q1. The source of the MOS transistor Q1 is configured to receive a voltage Vbat provided by the spare battery unit 100, and the drain of the MOS transistor Q1 is connected to the anode of the diode D via the inductor L. The fifth pin of the boost converter chip U1 is connected between the MOS transistor Q1 and the inductor L, and the first pin of the boost converter chip U1 is connected between the diode D and the inductor L. The cathode of the diode D is connected to the positive output end OUT+, and the cathode of the diode D is further connected to the ground via a resistor R9 and a resistor R8 that are connected in series. A capacitor C is also connected between the cathode of the diode D and the ground, that is, the capacitor C is connected in parallel with the series formed by the resistor R9 and the resistor R8.

The microprocessor can adjust the duty ratio of a PWM wave output to the base of the triode Q2 to change turned-on period and turned-off period of the triode Q2, and further control the turned-on period and the turned-off period of the MOS transistor Q1 to change correspondingly. Thus, the charging voltage is adjusted macroscopically.

The aforementioned voltage sampling unit 400 includes a first divider resistor R1 and a second divider resistor R2. One end of the first divider resistor R1 is connected to the positive output end OUT+, the other end of the first divider resistor R1 is connected to one end of the second divider resistor R2, and the other end of the second divider resistor R2 is connected to the ground. The microprocessor is connected between the first divider resistor R1 and the second divider resistor R2.

The aforementioned current sampling unit 500 includes a current sampling resistor R3 and a fourth resistor R4.

One end of the current sampling resistor R3 is connected to both one end of the fourth resistor R4 and the negative output end OUT−, the other end of the current sampling resistor R3 is connected to the ground, and the other end of the fourth resistor R4 is connected to the microprocessor.

The aforementioned power display unit 600 is preferably a LED lamp.

Figure 4:
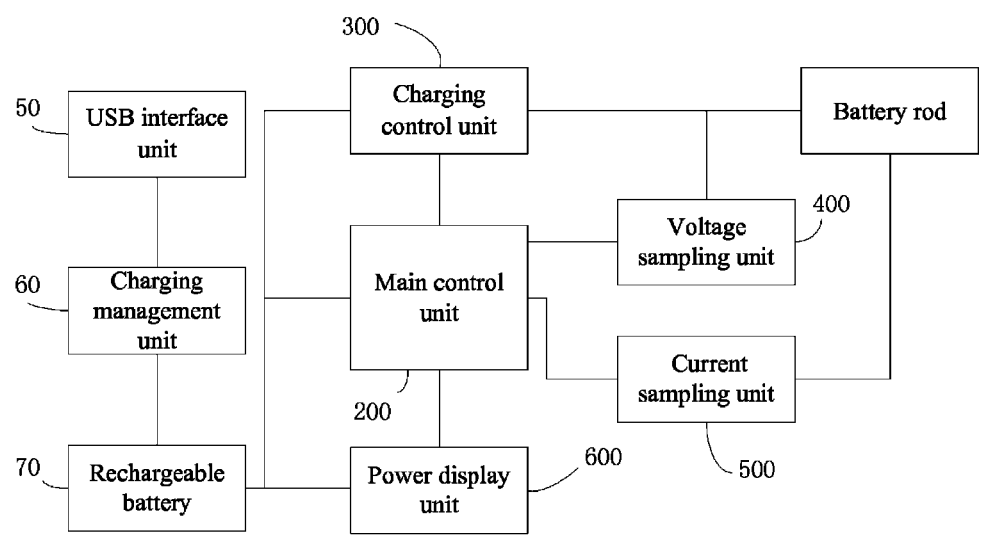
FIG. 4 is a block diagram of a battery power detecting device of a second embodiment of the present application.

Referring to FIG. 4, which is a block diagram of a battery power detecting device of a second embodiment of the present application.

The second embodiment differs from the first embodiment in that the battery in the spare battery unit 100 is different. In the second embodiment, the battery in the spare battery unit 100 is a rechargeable battery 70. The spare battery unit 100 further includes a USB interface unit 50 and a charging management unit 60.

The USB interface unit 50, the charging management unit 60, the rechargeable battery 70, and the charging control unit 300 are connected in series.

When the battery power detecting device is connected to an external power supply (not shown), the charging management unit 60 is configured to control the external power supply to charge the rechargeable battery 70 with constant current.

The charging management unit 60 includes a charging management chip, and the constant current charging process is achieved under control of the charging management chip. The type of the charging management chip is VA7204.

Figure 5:
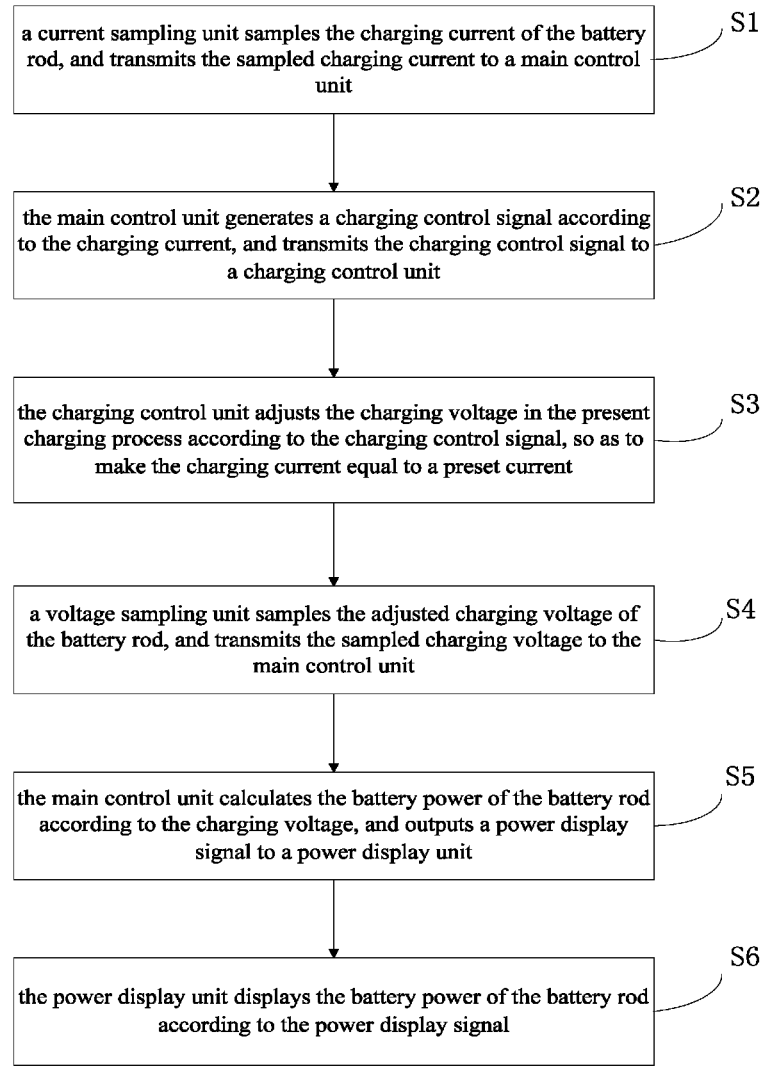
FIG. 5 is a flowchart of a battery power detecting method of the present application.

Referring to FIG. 5, which is a flowchart of a battery power detecting method of the present application.

The battery power detecting method of the present application is used to detect the battery power of a battery rod in an electronic cigarette. Referring to the aforementioned battery power detecting device, the battery power detecting method includes the steps as follows.

S1, a current sampling unit 500 samples the charging current of the battery rod, and transmits the sampled charging current to a main control unit 200.

S2, the main control unit 200 generates a charging control signal according to the charging current, and transmits the charging control signal to a charging control unit 300;

S3, the charging control unit 300 adjusts the charging voltage in the present charging status according to the charging control signal, so as to make the charging current equal to a preset current;

S4, a voltage sampling unit 400 samples the adjusted charging voltage of the battery rod, and transmits the sampled charging voltage to the main control unit 200;

S5, the main control unit 200 calculates the battery power of the battery rod according to the charging voltage, and outputs a power display signal to a power display unit 600;

S6, the power display unit 600 displays the battery power of the battery rod according to the power display signal, with at least one of an LED lamp, an LED display, and an LCD display.

The step S5 includes the sub-steps as follows.

S51, using the following formula to calculate the battery voltage of the battery rod according to the charging voltage:

$$Ubat = Uc - U1 - U2$$

Wherein, Ubat is the voltage of the battery in the battery rod, and Uc is the aforementioned latest adjusted charging voltage. U1 is an internal voltage drop of the battery rod. Whether a battery rod has a charging management circuit or not, other circuits inside the battery rod cause a certain internal voltage drop. When the charging current is 60 mA, the internal voltage drop is generally 0.1V. U2 is a voltage drop of the current sampling resistor R3. For example, when the charging current is 60 mA, and the resistance of the current sampling resistor R3 is 2.2E2, the voltage drop of the current sampling resistor R3 is 60 mA*2.2Ω=0.132V, and Ubat=Uc−0.232V.

S52, calculating the battery power of the battery rod according to the voltage Ubat. The voltage Ubat can be used to calculate the battery power of the battery rod by looking up preset tabulations, such as above Tabulation 1.

Figure 6:
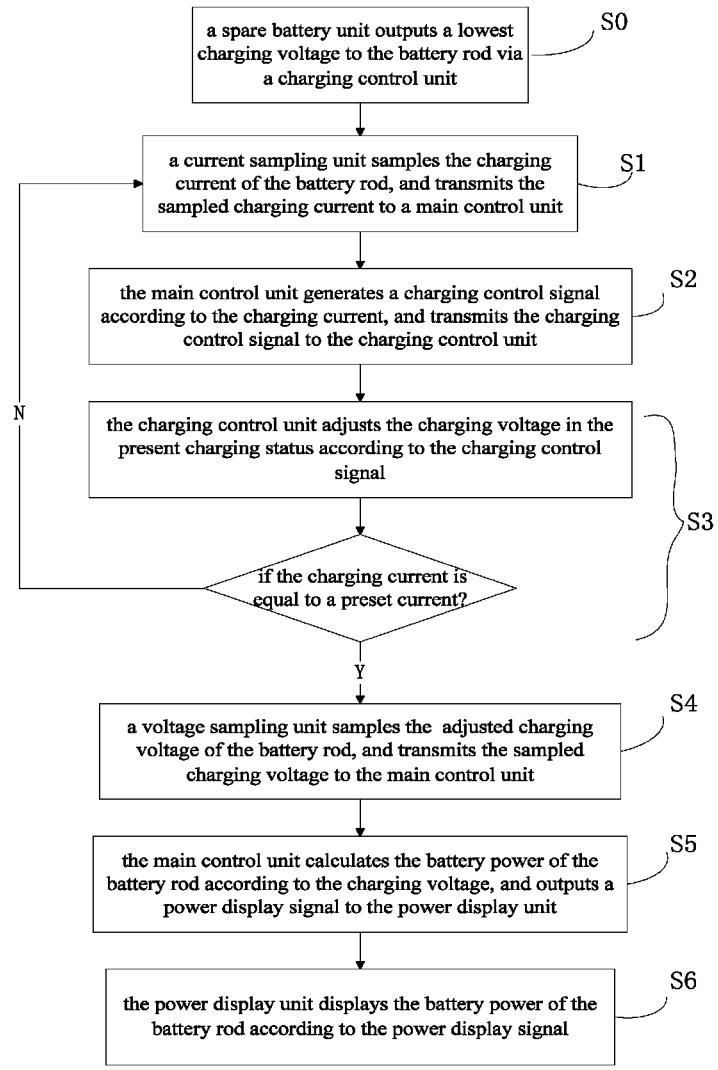
FIG. 6 is a flowchart of a battery power detecting method of a first embodiment of the present application.

Referring to FIG. 6, which is a flowchart of a battery power detecting method of a first embodiment of the present application.

In particular, the battery power detecting method of the first embodiment of the present application further includes this step:

S0, before the step S1, the spare battery unit 100 outputs a lowest charging voltage to the battery rod via the charging control unit 300. For example, the adjusting range of the charging voltage of a battery rod is generally 3.3V-4.2V. Therefore, the charging voltage when the battery rod is inserted into the battery power detecting device is preset, which is 3.3V.

In the step S3, the method for making the charging current equal to the preset current comprises sampling the charging current continuously. If the charging current is larger than the preset current, the charging voltage is fitly reduced; and if the charging current is less than the preset current, the charging voltage is fitly boosted. After the charging voltage has been reduced or boosted, the procedure turns to the step S1. The charging current is sampled and compared with the preset current again, and is adjusted again if needed, until the charging current is equal to the preset current. And then the current charging voltage is sampled according to the step S4.

While the embodiments of the present application have been described with reference to the drawings, the present application will not be limited to above embodiments that are illustrative but not limitative. It will be understood by those skilled in the art that various changes and equivalents may be substituted in the light of the present application without departing from the scope of the present application, and those various changes and equivalents shall fall into the protection of the application.

What is claimed is:

1. A battery power detecting device configured to detect the battery power of a battery rod of an electronic cigarette, comprising: a spare battery unit, a current sampling unit, a voltage sampling unit, a charging control unit, a main control unit, and a power display unit;
the main control unit is connected to the spare battery unit, the current sampling unit, the voltage sampling unit, the charging control unit, and the power display unit respectively; the current sampling unit, the voltage sampling unit, and the charging control unit are all connected to the battery rod; and both the charging control unit and the power display unit are connected to the spare battery unit;
the main control unit includes a microprocessor;
the battery rod includes a positive output end and a negative output end;
the charging control unit includes a MOS transistor, a boost converter chip, a triode, an inductor, a diode, a first resistor, a second resistor, and a third resistor; and the type of the boost converter chip is CP2121;
the fourth pin of the boost converter chip is connected to the microprocessor, and the fourth pin of the boost converter chip is further connected to the base of the triode via the first resistor; the base of the triode is further connected to the ground via the second resistor, the emitter of the triode is connected to the ground, the collector of the triode is connected to the source of the MOS transistor via the third resistor, and the collector of the triode is further connected to the gate of the MOS transistor; the source of the MOS transistor is configured to receive a voltage provided by the spare battery unit, and the drain of the MOS transistor is connected to the anode of the diode via the inductor; the fifth pin of the boost converter chip is connected between the MOS transistor and the inductor, the first pin of the boost converter chip is connected between the diode and the inductor, and the cathode of the diode is connected to the positive output end.

2. The battery power detecting device according to claim 1, wherein, the voltage sampling unit includes a first divider resistor and a second divider resistor; one end of the first divider resistor is connected to the positive output end, the other end of the first divider resistor is connected to one end of the second divider resistor, and the other end of the second divider resistor is connected to the ground; the sharing node of the first divider resistor and the second divider resistor is connected to the microprocessor.

3. The battery power detecting device according to claim 1, wherein, the current sampling unit includes a current sampling resistor and a fourth resistor; one end of the current sampling resistor is connected to both one end of the fourth resistor and the negative output end, the other end of the current sampling resistor is connected to the ground, and the other end of the fourth resistor is connected to the microprocessor.

4. The battery power detecting device according to claim 1, wherein, the power display unit includes at least one of an LED lamp, an LED display, and an LCD display.

5. A battery power detecting method configured to detect the battery power of a battery rod of an electronic cigarette in a charging process, comprising following steps:
S1, a current sampling unit samples the charging current of the battery rod, and transmits the sampled charging current to a main control unit;
S2, the main control unit generates a charging control signal according to the charging current, and transmits the charging control signal to a charging control unit;
S3, the charging control unit adjusts the charging voltage in the present charging status according to the charging control signal, so as to make the charging current equal to a preset current;
S4, a voltage sampling unit samples the adjusted charging voltage of the battery rod, and transmits the sampled charging voltage to the main control unit;
S5, the main control unit calculates the battery power of the battery rod according to the charging voltage, and outputs a power display signal to a power display unit;
S6, the power display unit displays the battery power of the battery rod according to the power display signal;
wherein the main control unit includes a microprocessor;
the battery rod includes a positive output end and a negative output end;
the charging control unit includes a MOS transistor, a boost converter chip, a triode, an inductor, a diode, a first resistor, a second resistor, and a third resistor; and the type of the boost converter chip is CP2121;
the fourth pin of the boost converter chip is connected to the microprocessor, and the fourth pin of the boost converter chip is further connected to the base of the triode via the first resistor; the base of the triode is further connected to the ground via the second resistor, the emitter of the triode is connected to the ground, the collector of the triode is connected to the source of the MOS transistor via the third resistor, and the collector of the triode is further connected to the gate of the MOS transistor; the source of the MOS transistor is configured to receive a voltage provided by the spare battery unit, and the drain of the MOS transistor is connected to the anode of the diode via the inductor; the fifth pin of the boost converter chip is connected between the MOS transistor and the inductor, the first pin of the boost converter chip is connected between the diode and the inductor, and the cathode of the diode is connected to the positive output end.

6. The battery power detecting method according to claim 5, wherein, the step S5 includes these sub-steps:
S51, using the following formula to calculate the battery voltage of the battery rod according to the charging voltage:

$$U_{bat} = U_c - U_1 - U_2;$$

wherein Ubat is the battery voltage of the battery rod, Uc is the charging voltage, U1 is an internal voltage drop of the battery rod, and U2 is a voltage drop of a current sampling resistor;
S52, calculating the battery power of the battery rod according to the voltage Ubat.

* * * * *